United States Patent [19]

Miller

[11] Patent Number: 5,302,882
[45] Date of Patent: Apr. 12, 1994

[54] LOW PASS FILTER FOR PLASMA DISCHARGE

[75] Inventor: Paul A. Miller, Albuquerque, N. Mex.

[73] Assignee: Sematech, Inc., Austin, Tex.

[21] Appl. No.: 965,629

[22] Filed: Oct. 22, 1992

Related U.S. Application Data

[63] Continuation of Ser. No. 756,649, Sep. 9, 1991, abandoned.

[51] Int. Cl.⁵ .................................. H01J 7/24
[52] U.S. Cl. .................. 315/111.21; 315/111.71; 315/111.81; 313/231.31; 333/99 PL

[56] References Cited

U.S. PATENT DOCUMENTS

| | | | |
|---|---|---|---|
| 4,207,137 | 6/1980 | Tretola | 156/627 |
| 4,579,618 | 4/1986 | Celestino et al. | 156/345 |
| 4,589,123 | 5/1986 | Pearlman et al. | 315/111.71 X |
| 4,602,981 | 7/1986 | Chen et al. | 156/627 |
| 4,617,079 | 10/1986 | Tracy et al. | 156/345 |
| 4,622,094 | 11/1986 | Otsubo | 156/627 |
| 4,795,529 | 1/1989 | Kawasaki et al. | 156/643 |
| 4,812,712 | 3/1989 | Ohnishi et al. | 315/176 |
| 4,824,456 | 4/1989 | Ohmi | 204/298 |
| 4,824,546 | 4/1989 | Ohmi | 204/298 |
| 4,846,920 | 7/1989 | Keller et al. | 156/345 |
| 4,874,494 | 10/1989 | Ohmi | 204/192.12 |
| 4,877,999 | 10/1989 | Knapp et al. | 315/111.21 X |
| 4,935,661 | 6/1990 | Heinecke et al. | 315/111.91 X |
| 4,950,376 | 8/1990 | Hayashi et al. | 204/192.32 |
| 4,956,043 | 9/1990 | Kanetomo et al. | 156/345 |
| 4,968,374 | 11/1990 | Tsukada et al. | 156/345 |
| 4,973,883 | 11/1990 | Hirose et al. | 315/111.41 |
| 5,028,847 | 7/1991 | Greb et al. | 315/111.21 |
| 5,111,111 | 5/1992 | Stevens et al. | 315/111.4 |

FOREIGN PATENT DOCUMENTS

| | | |
|---|---|---|
| 0167703 | 1/1986 | European Pat. Off. |
| 2663806 | 12/1991 | France |
| 58-209117 | 6/1983 | Japan |
| 63-14863 | 1/1988 | Japan |

OTHER PUBLICATIONS

"Electrical Isolation of Radio-Frequency Plasma Discharges", J. Appl. Phys., vol. 71, No. 3, Feb. 1992, Paul A. Miller, pp. 1171-1176.

"MOVPE Growth of II-VI Compounds in a Vertical Reactor with High-Speed Horizontal Rotating Disk", 2300 Journal of Crystal Growth, 107 (1991) Jan. 1, Nos. 1/4, Amsterdam, Netherlands.

*Primary Examiner*—Robert J. Pascal
*Assistant Examiner*—Michael B. Shingleton
*Attorney, Agent, or Firm*—William W. Kidd

[57] ABSTRACT

An isolator is disposed between a plasma reactor and its electrical energy source in order to isolate the reactor from the electrical energy source. The isolator operates as a filter to attenuate the transmission of harmonics of a fundamental frequency of the electrical energy source generated by the reactor from interacting with the energy source. By preventing harmonic interaction with the energy source, plasma conditions can be readily reproduced independent of the electrical characteristics of the electrical energy source and/or its associated coupling network.

13 Claims, 4 Drawing Sheets

LOW PASS FILTER FOR PLASMA DISCHARGE

This application is a continuation of U.S. patent application Ser. No. 756,649, filed Sep. 9, 1991, now abandoned.

BACKGROUND OF THE INVENTION

1. Field of the Invention

The present invention relates to the field of plasma processing and, more particularly, to the use of plasma equipment for modification of materials.

2. Prior Art

Plasma processing equipment is used extensively in the industry for the modification of materials. These modifications include etching and deposition of films for fabrication of microelectronic circuits and semiconductor devices. The modifications also may include implantation of chemical species that change the friction and wear properties of surfaces.

A plasma is a gas (or a gas mixture) which is energized so that it is partially decomposed into species that are electrically charged. A variety of techniques are known for energizing the gas. One commonly used technique is the energizing of the gas by imposing an electric field on the gas from an external source. A common practice is to use high frequency alternating-current (AC) fields to energize or excite the gas. For example, radio-frequency (RF) fields are generated at frequency ranges near 10 MHz. At still higher frequencies, in the order of 1000 MHz, microwave fields are generated. In some instances, these electric fields are utilized in combination with magnetic fields which are used for the purpose of confining the plasma. Electron cyclotron resonance (ECR) plasma processing is one technique for controlling the plasma with the use of electric and magnetic fields.

The plasma is typically retained in a chamber of a processing equipment and isolated from the surrounding ambient and this plasma usually contains species that undergo chemical reactions. The plasma chamber and its gas-handling equipment are typically referred to as a reactor. The source of the electrical power that energizes the plasma is commonly referred to as a generator. Usually, there are a number of components, including cables, wave guides, inductors, capacitors, matching network, tuner and/or an impedance transforming network coupling the generator to the reactor. These components are included in a system sometimes referred to as a coupler or a coupling system. The generator and the coupling system together comprise the AC source that energizes the plasma.

Various schemes have been devised in the prior art for coupling the generator, coupler, and the reactor to operate as a plasma processing system for example, in U.S. Pat. No. 4,824,546 (Ohmi) an RF power source is coupled to a vacuum vessel through a matching circuit in order to provide a sputtering apparatus for forming an insulating thin film. Band reject filters are provided to permit only high frequencies to be supplied.

Another example is disclosed in U.S. Pat. No. 4,579,618 (Celestino et al.) in which two power sources are each coupled through a matching network to a plasma reactor. A filter/combiner is coupled between the low frequency power supply and the high frequency power supply. The filter/combiner serves three purposes which are unique to a single electrode, dual frequency plasma reactor. The power of each power supply must be largely prevented from reaching the other power supply, the mixing products caused by the coupling of two different frequencies to a non-linear load must be attenuated and the radiation emitted by the reactor and the various interconnections must be minimized.

A key feature of most plasmas, is that the plasmas have "non-linear" impedance characteristics. Non-linearity is a mathematical definition signifying that the magnitude of the voltage (electric field) in the plasma is not directly proportional to the magnitude of the current (magnetic field). Typically, the generators employed in various plasma systems are designed to generate an output of predominantly single-frequency. However, because of the non-linearity of the plasma, signals at multiples of the fundamental generator frequency are generated by the plasma. These multiple frequencies of the fundamental frequency are called harmonic frequencies (or harmonics). The amplitude of the harmonics affect certain properties of the plasma, such as direct current (DC) bias, which impact the particular plasma process. The amplitude of the harmonics is determined by the interaction of the plasma with the generator and the coupling system and is difficult to control simply by adjusting the amplitude of the fundamental frequency component.

Plasma non-linearity is a phenomenon which plays an important role in causing the plasma conditions to be dependent upon the electrical characteristics of the generator, as well as the coupling system, at both the operating (fundamental) frequency of the generator and at the various harmonic frequencies. That is, if satisfactory operation of a plasma reactor is achieved for a given generator and coupling system, the parameters of the generator and the coupling system cannot be readily changed without affecting the plasma itself. Thus, generally it is impractical, if not possible, to make changes to the electrical parameters of the generator and/or the coupling system and still be able to reproduce the desired plasma conditions, simply by readjusting the amplitude of the generator output. Typically, what is required is a considerable retuning of the system in order to satisfactorily couple the reactor to the generator and/or the coupling system to obtain the desired plasma conditions.

Therefore, it is difficult to replace a generator from a first manufacturer with a generator from a second manufacturer and obtain the same plasma conditions, unless the electrical parameters of the two generators are identical. Similarly, if a change is made to an impedance matching network in the coupling system, due to a component change for example, the same plasma conditions cannot be reproduced unless the networks are substantially identical. Merely changing the amplitude of the generator output will not compensate for the impedance differences in the generator and/or the coupling system.

An added problem also exists when certain parameters associated with two systems are not substantially identical. If two installations of plasma systems are made using identical generators and reactors but different lengths of coaxial cable (wave guides and/or other transmission mediums) are utilized in the systems then generally identical plasma conditions cannot be reproduced. In actual practice, this lack of reproducibility of desired operating plasma conditions under realistic conditions presents significant difficulties to the user. For example, if an RF generator requires service and/or corrective repair, it can only be replaced with another identical RF generator without undue tuning and adjustment.

Accordingly, it is appreciated that a plasma system which is flexible in design to accommodate a multitude of generator sources, as well as coupling systems, such that the reactor could repeatedly reproduce desirable plasma operating conditions, will provide for an improvement over the prior art.

SUMMARY OF THE INVENTION

The present invention describes an isolator for isolating a plasma reactor from its electrical energy source. The isolator is a low-pass electrical filter which permits the passage of the fundamental frequency of an electrical energy source supplying electrical energy to the reactor, but blocks transmission of harmonic frequencies. Because the plasma operates with non-linear impedance characteristics and the amplitudes of these harmonics affect properties of the plasma, the plasma conditions are usually dependent upon the electrical characteristics of the generator, as well as the entire coupling system. However, by attenuating and substantially preventing the harmonics from interacting with the generator and with the coupling circuitry that couples the generator to the isolator, this dependence is eliminated. The reactor is made to operate substantially independent of the effects in the change of the generator and/or the coupling system due to the harmonic isolation and permits substitution of the generator and/or the coupling system without undue hardship in tuning the system to reproduce the desired plasma conditions.

DETAILED DESCRIPTION OF THE PREFERRED EMBODIMENTS

An apparatus and method for providing an isolator for a plasma reactor is described. In the following description, numerous specific details are set forth, such as specific circuits, reactors, processes, etc., in order to provide a thorough understanding of the present invention. However, it will be obvious to on skilled in the art that the present invention may be practiced without these specific details. In other instances, well-known processes and structures have not been described in detail in order not to unnecessarily obscure the present invention.

Prior Art

Figure 1:
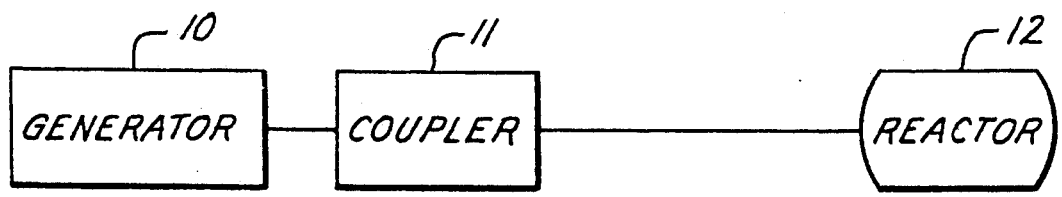
FIG. 1 is a block diagram of a prior art plasma reactor showing a generator and a reactor coupled by a coupler.

Referring to FIG. 1, a prior art plasma reactor system is shown. A generator 10 for providing an alternating current electric field to energize or excite the gas (or gas mixture) to form the plasma is coupled to reactor 12 through a coupler 11. The generator 10 is typically of RF or microwave frequency in which the desired operating (fundamental) frequency is selected. The amplitude of the output of generator 10 is adjustable.

Reactor 12 includes the equipment containing the plasma chamber, as well as its gas handling apparatus. The plasma gas (or gas mixture) is introduced into the chamber for it to operate on a target device. The target device for whose properties are to be modified is also present in the chamber. The coupler 11 can be of a variety of couplers utilized in coupling generator 10 to reactor 12. For example, coupler 11 can be a blocking capacitor or an impedance matching network. Although shown as coupler 11 it also includes the complete coupling system, including the various transmission cables, wave guides, connectors, etc., which comprise the transmission medium between generator 10 and reactor 12. The purpose of the coupler 11 is to match the impedance, as well as other circuit parameters, between the generator 10 and reactor 12, in order to provide for an efficient transfer of electrical energy from generator 10 to reactor 12.

As was earlier described in the background of the invention, a particular reactor 12 is coupled to operate with a particular generator 10 and coupler 11. In order to obtain the desired plasma conditions, considerable amount of tuning is required to obtain those desired plasma conditions in reactor 12. During operation of the system in FIG. 1, the amplitude of generator 10 can be adjusted to vary the plasma conditions in reactor 12.

A significant disadvantage of the prior art plasma system of FIG. 1 is that the desired plasma conditions typically cannot be reproduced readily, if any significant characteristic of the generator 10 and/or the coupler 11 is changed. If, for example, another generator is substituted in place of generator 10 and/or another coupler is substituted for coupler 11, then in most instances, unless the new generator and/or coupler is identical in electrical characteristics to the one substituted, the desired plasma conditions typically cannot be reproduced in reactor 12 without further adjustment.

In order to obtain the desired plasma conditions again, the system of FIG. 1 must be retuned to accommodate the new generator and/or coupler. Thus, the system of FIG. 1 must necessarily depend on the particular generator 10 and coupler 11 to be tuned to operate with reactor 12. In the event a component having different electrical characteristics is to be substituted, considerable amount of time and effort are required to retune the system. Thus, anytime generator 10 and/or coupler 11 require repair and/or service, the plasma system will necessarily require a complete "shut-down" while the reactor is reconfigured and retuned to the new system. In practice, the lack of reproducibility of desired plasma conditions in reactor 12 provides for an inflexible system which may pose economic hardship to the user of the plasma equipment.

Present Invention

Figure 2:
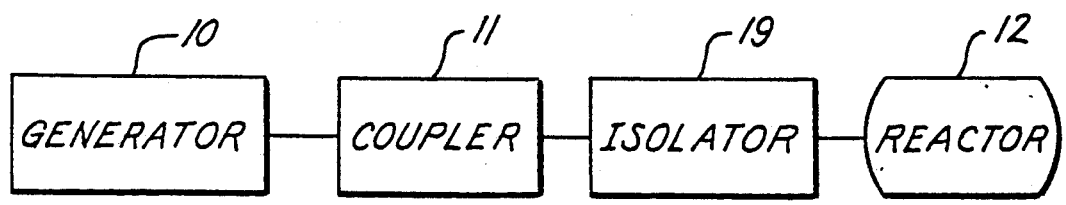
FIG. 2 is a block diagram of a plasma reactor system of the present invention utilizing an isolator to isolate the reactor from the generator and the coupler.

Referring to FIG. 2, a plasma reactor system of the present invention is shown. The apparatus of the present invention is comprised of the same prior art generator 10, coupler 11 and reactor 12. However, isolator 19 of the present invention is inserted between coupler 11 and reactor 12. The purpose of isolator 19 is to isolate the reactor 12 from the electrical energy generating source and transmission medium provided by generator 10 and coupler 11.

Isolator 19 is designed to permit the transmission of the electrical energy at the fundamental operating frequency of the generator 10, but to inhibit the transmission of higher frequencies, predominantly the harmonics. Therefore, the harmonic content of the electrical signal from reactor 12 is significantly prevented from reaching coupler 11 and generator 10. Because of the harmonic isolation, the plasma in reactor 12 cannot interact with, nor respond to changes in, the impedances of generator 10 and coupler 11 at the harmonic frequencies. Changes made to generator 10 and/or coupler 11 can be readily compensated by the adjustment of the amplitude of the output signal from generator 10, which is for the purpose of adjusting the amplitude of the fundamental frequency component.

Thus, substitutions for generator 10 and coupler 11 can be readily made by non-identical generators and couplers, wherein the desired plasma conditions in the reactor 12 can be reproduced by adjusting the amplitude of the output signal from generator 10. The harmonics generated due to the nonlinearity of the plasma are prevented from substantially interacting with the generator 10 and/or the coupler 11. A variety of interactions can occur, one such being the change of the impedance of the generator 10 and/or coupler 11 caused by the harmonics. Another interaction being the feedback of harmonics generated by reactor 12, transmitted to generator 10 and coupler 11, and reflected from generator 10 and/or coupler 11, so as to either strengthen or cancel the harmonics at the reactor 12.

Figure 3:
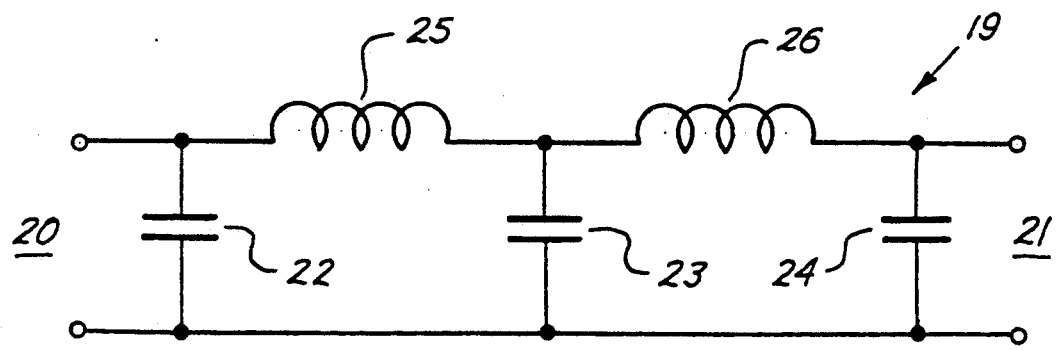
FIG. 3 is a circuit schematic diagram of a low-pass filter which is utilized as one embodiment for the isolator of FIG. 2.

Although a variety of electrical devices can be utilized for isolator 19, the preferred embodiment utilizes a tuned electrical filter. The tuned electrical filter of the preferred embodiment is a low-pass filter and is shown in FIG. 3. Referring to FIG. 3, the particular low-pass filter utilized in the preferred embodiment is a Chebyshev filter, which is comprised of five circuit components 22–26. Two $\pi$-sections are utilized between input terminals 20 and output terminals 21. The input terminals 20 are coupled to the coupler 11 (actually the transmission medium), while the output terminals 21 are coupled to reactor 12. One of the input terminals 20 and one of the output terminals 21 are coupled together to operate as an electrical return (typically ground potential of the electrical system). Capacitor 22 is coupled across the input terminals 20, while capacitor 24 is coupled across the output terminals 21. Two inductors 25 and 26 are coupled in series between the non-returning input and output terminals. A third capacitor 23 is coupled between the junction of the two inductors and the return line. In the preferred embodiment, capacitors 22 and 24 have the values of 220.9 pF, while capacitor 23 has the value of 310.6 pF. The inductors 25 and 26 each have a value of 935.1 nH.

Figure 4:
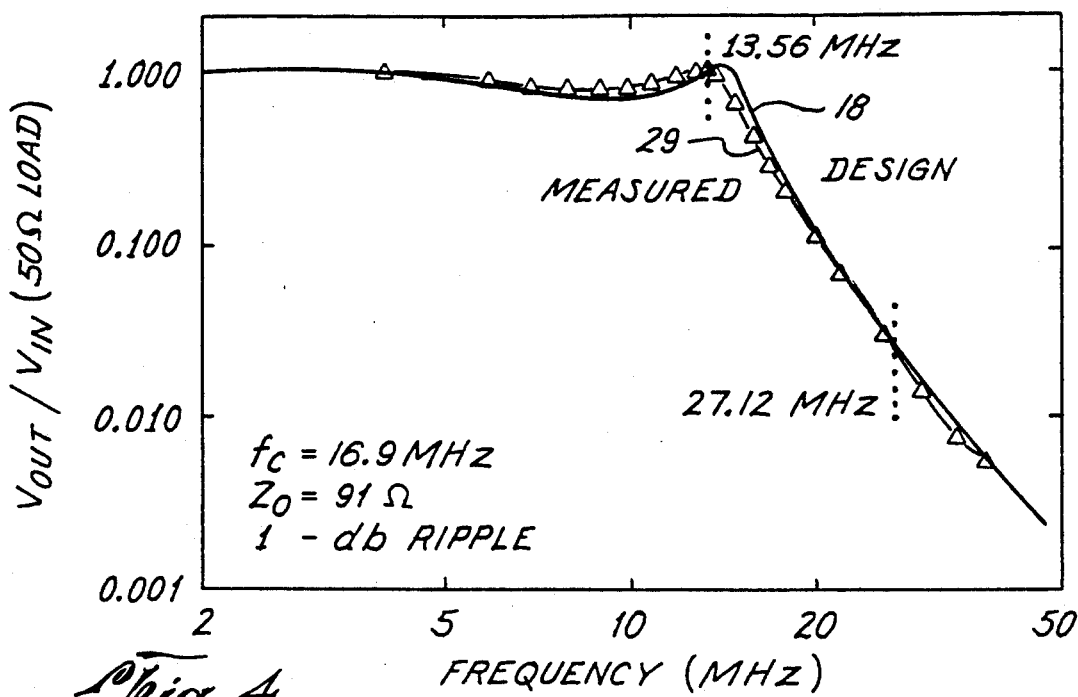
FIG. 4 is a graphic representation of a frequency response curve $V_{OUT}/V_{IN}$ of an ideal filter and measured values for the circuit of FIG. 3.

FIG. 4 shows a graphical representation of the theoretically designed response of the filter of FIG. 3 as curve 18 and the actual measured response of the filter of FIG. 3 as curve 29. As is noted, the fundamental frequency is set at 13.56 MHz. As is also noted in the graph of FIG. 4 the second harmonic frequency of 27.12 MHz is well below the $-3$ db point. Thus, by utilizing a low-pass filter for isolator 19, the harmonic signals generated by the reactor 12 are largely prevented from interacting with the generator 10 and/or coupler 11. The fundamental frequency component from generator 10 is passed through coupler 11 and through the isolator 19 to energize the plasma in reactor 12. The desired operating conditions can be readily achieved by adjusting the amplitude of generator 10. Accordingly, substitution of generator 10, coupler 11 and/or other components in the transmission medium can be easily compensated by adjusting the amplitude of generator 10 to obtain the desired plasma conditions in reactor 12. The harmonics generated by the reactor 12 are essentially "trapped" by isolator 19 and are substantially prevented from interacting with generator 10 and coupler 11.

It is appreciated then that reactor 12 can be readily coupled to a variety of generators, couplers, and/or transmission medium, wherein the desired plasma conditions can be readily reproduced by simply adjusting the frequency of the generator 10 to the desired fundamental frequency and adjusting the amplitude of the electrical signal from generator 10.

Experimental Results

Figure 5:
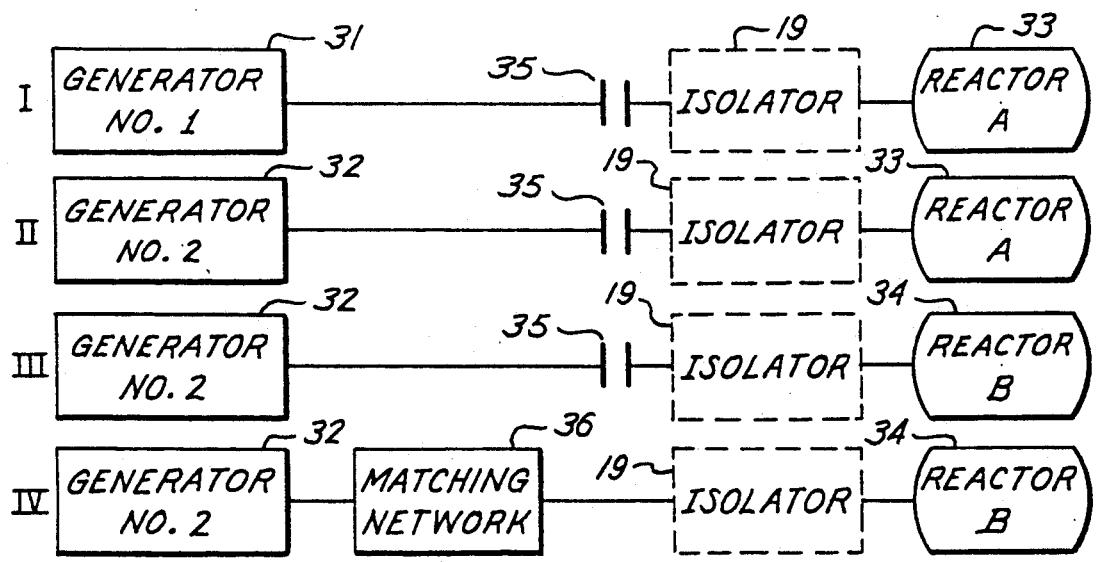
FIG. 5 is a block diagram showing four different plasma system arrangements with and without the isolator of the present invention which were used in providing experimental results.

Referring to FIG. 5, block diagrams for four different plasma systems with and without the isolator 19 are shown. These eight different arrangements provided the experimental results illustrated in FIGS. 6–9. In Configuration I, generator 31 is coupled to reactor 33 (designated also as "Reactor A"), wherein blocking capacitor 35 is utilized as part of coupler 11. In Configuration II, a second generator 32 is coupled to reactor 33 through the blocking capacitor 35. In Configuration III, generator 32 is coupled to a second reactor 34 (designated also as "Reactor B") through the blocking capacitor 35. In Configuration IV, generator 32 is coupled to the same reactor 34, but a matching network 36 is utilized instead of blocking capacitor 35. These four configurations which do not include isolator 19 are designated as $I_0$, $II_0$, $III_0$, and $IV_0$ and represent four different prior art arrangements. With the same four configurations, isolator 19 (shown as dotted in FIG. 5) is now included and represent four arrangements $I_F$, $II_F$, $III_F$, and $IV_F$.

The results of the four configurations with and without the filter of the present invention are shown in the resultant graphs of FIGS. 6–9. All data represent discharges in argon gas at 100 mTorr pressure and 200 volts peak-to-peak excitation at fundamental frequency of 13.56 MHz. In the particular example, the first generator 31 is model SG-1250 manufactured by R. D. Mathis Co., while the second generator 32 is model ACG-5 manufactured by ENI Power Systems. The matching network 36 is "Matchwork MW-5", also from ENI Power Systems.

Figure 6:
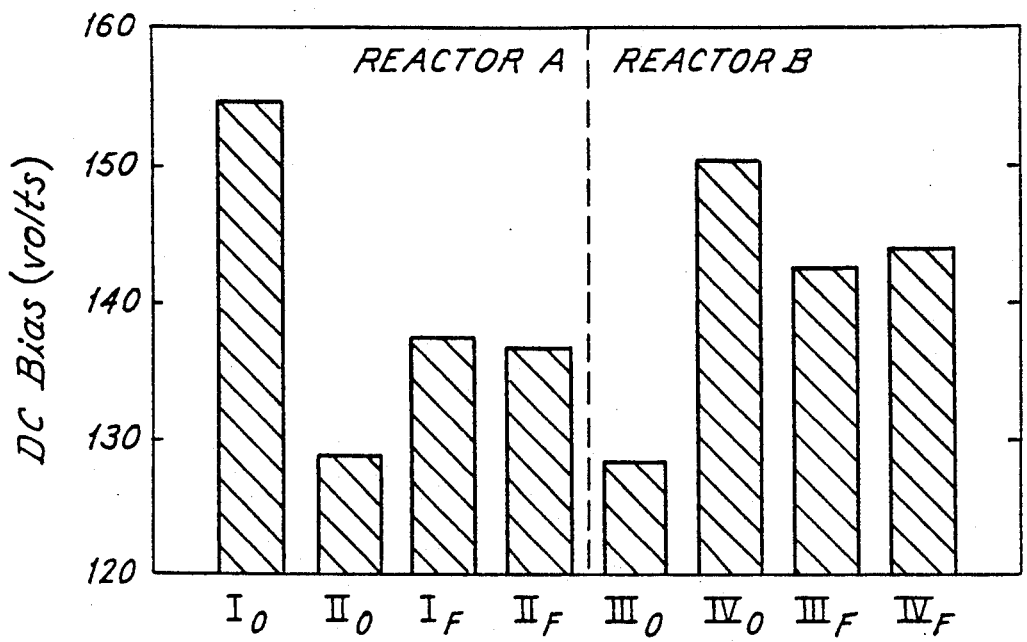
FIG. 6 is a graphical representation of DC Bias voltage measured for the eight systems shown in FIG. 5.
Figure 7:
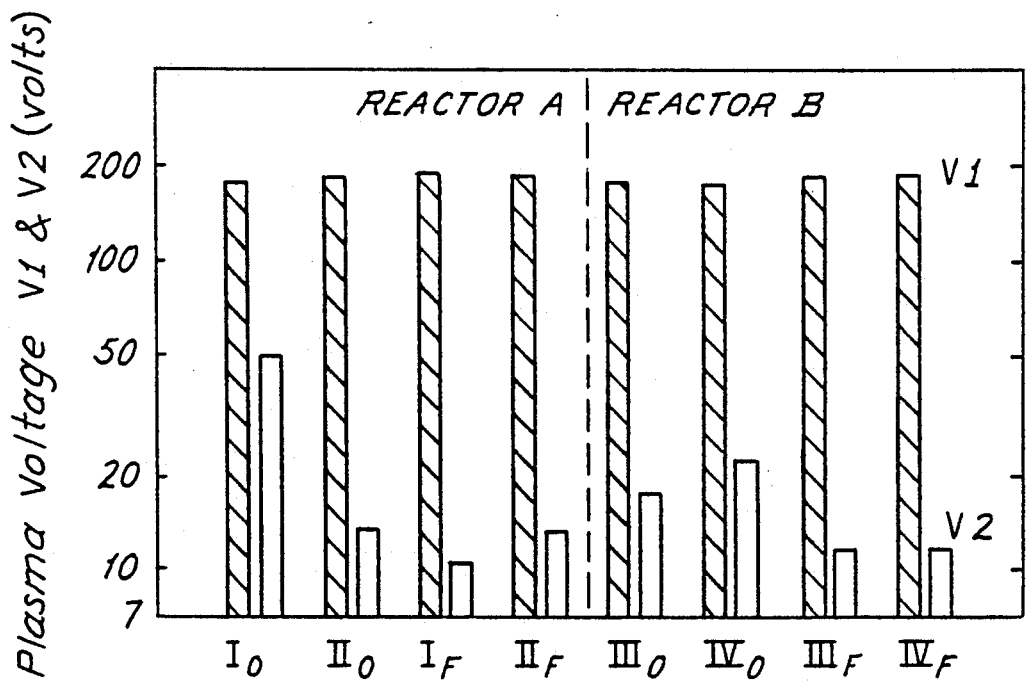
FIG. 7 is a graphical representation of plasma voltages measured for the eight systems shown in FIG. 5.
Figure 8:
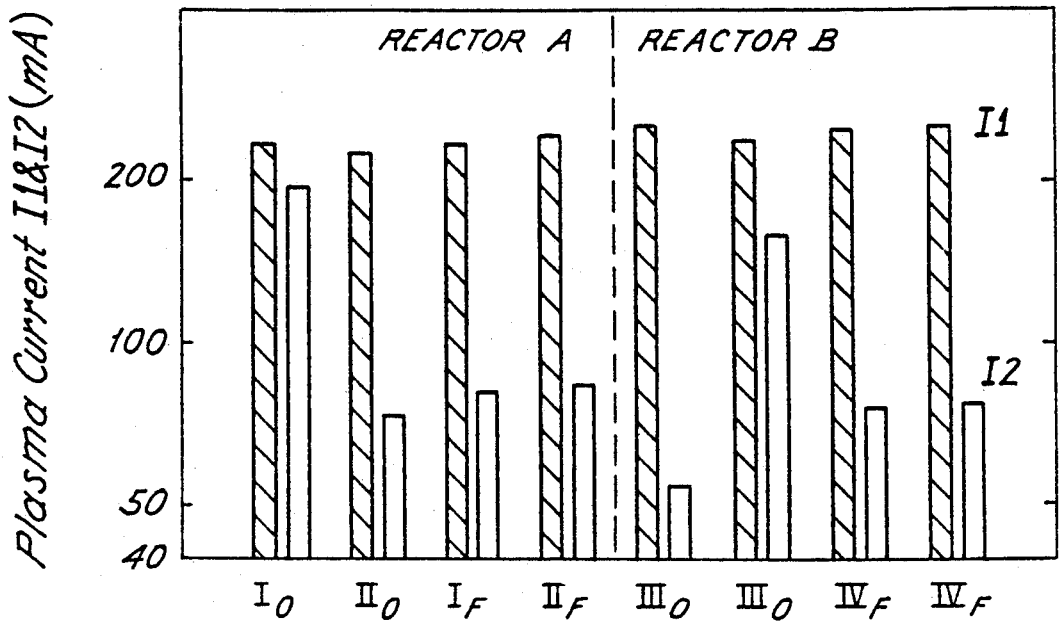
FIG. 8 is a graphical representation of plasma currents measured for the eight systems shown in FIG. 5.
Figure 9:
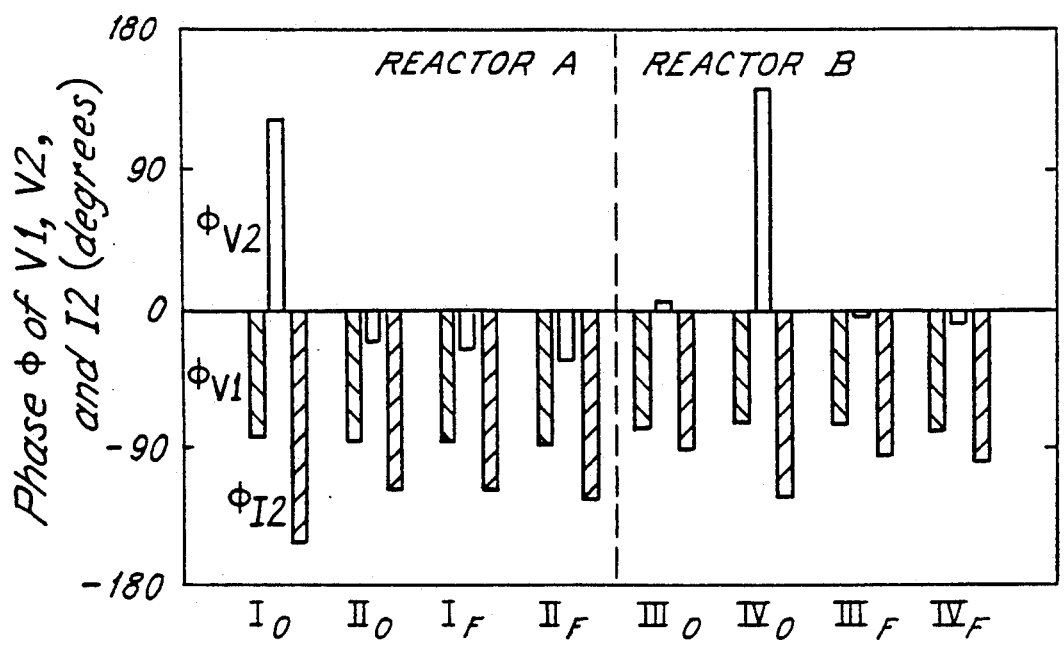
FIG. 9 is a graphical representation of phase differences for plasma voltages and currents measured for the eight systems shown in FIG. 5.

Referring to FIGS. 6–9, in all four of these graphs, the results obtained from the first two configurations (I and II) pertaining to reactor A are shown on the left half portion of the diagram, while configurations III and IV, pertaining to reactor B are shown on the right half portion of the diagram. FIG. 6 shows the measurement of the DC Bias voltage in each of the configurations. FIG. 7 shows the magnitude of the Fourier coefficients of the fundamental (V1) and the second harmonic (V2) of the plasma voltage in each of the four configurations with and without the filter. FIG. 8 shows the magnitude of the Fourier coefficient of the plasma current at the fundamental (I1) and at the second harmonic frequency (I2) in each of the four configurations with and without the filter. FIG. 9 shows the phase $\phi$ of the Fourier coefficients of the voltages V1, V2 and current I2. The phase of the current I1 is not indicated on the graph simply because the selected value for the phase of I1 is chosen as zero degrees.

Notice that in FIG. 6, for Reactor A, the DC Bias voltage of the reactor is measured at approximately 155 volts for configuration $I_0$ (without the filter). When generator 31 is substituted by a different generator 32, which is the condition shown in Configuration $II_0$, the DC Bias voltage in the reactor drops to approximately 129 volts. However, when the isolator 18, in the form of the low-pass Chebyshev filter is used, the same DC bias, approximately 138 volts, is measured regardless of which generator 31 or 32 is used to energize the reactor (Configurations $I_F$ and $II_F$). This illustrates the fact that the presence of isolator 19 of the present invention permits for the substitution of the generator 32 for 31, but wherein such substitution does not appreciably change the DC Bias voltage of Reactor A. Similar results are shown for Reactor B in comparing conditions shown in $III_F$ and $IV_F$ of FIG. 6.

In FIG. 7, it is noted that the plasma voltage V1 at the fundamental frequency is fairly uniform with and without the isolator 19. However, the second harmonic content varies significantly when the filter of the present invention is not utilized (Compare $I_0$ and $II_0$; and compare $III_0$ and $IV_0$). This fact is significantly noted in $I_0$ and $II_0$, wherein the plasma voltage of the second harmonic (V2) varies from 50 volts to 15 volts. When the filter is utilized, the disparity of the values of the second harmonic voltage is reduced significantly.

Similar comparisons can be readily made for the plasma current graphs of FIG. 8 and the overall resultant phase differences of current and voltage phases ($\phi$) as shown in FIG. 9. These illustrations conclusively exemplify the insensitivity of the reactor conditions to changes in generator and coupler that is caused by the presence of the isolator 19 of the present invention. The plasma system operates to provide substantially uniform plasma conditions for a given reactor even when the electrical energy source or the energy transfer medium is varied or substituted.

It is appreciated that although one particular Chebyshev low-pass filter is shown in four experimental configurations of plasma systems, the type of filter is a mere design choice. A variety of other configurations can be readily adapted for use with the isolator of the present invention. Furthermore, the frequency of operation is a design choice and can be readily selected in the RF, microwave or other bands. The filter will necessarily be designed to reflect the frequency of operation. It is to be noted also that the isolator can be designed as part of the reactor equipment.

I claim:

1. In a plasma processing apparatus, having a reactor for processing a reactive gas and wherein said reactor is coupled to a first electrical source which provides an electrical signal at a fundamental frequency f to generate an electrical energy field in said reactor for generation of plasma, the improvement comprising:

an electrical filter coupled between said reactor and said first electrical source for passing said frequency f, but inhibiting harmonics of said fundamental frequency f generated due to a non-linear response characteristic of said plasma in said reactor from interacting with electrical circuit parameters of said first electrical source, such that a second electrical source can be readily substituted in place of the first electrical source and wherein original plasma characteristics can be substantially restored by adjusting the amplitude of an electrical signal from said second electrical source at frequency f, but without requiring retuning of said second electrical source.

2. The improvement of claim 1 wherein said electrical filter is a low-pass electrical filter.

3. In a plasma processing apparatus, having a reactor for processing a reactive gas and wherein said reactor is coupled to a first electrical energy source which provides an electrical signal at a fundamental frequency f to generate an electrical energy field for generation of plasma in said reactor, and an electrical filter is coupled between said reactor and said first electrical energy source for passing said frequency f, but inhibiting harmonics of said fundamental frequency f generated due to a non-linear response characteristic of said plasma in said reactor from interacting with electrical circuit parameters of said first electrical energy source, such that when a second electrical energy source is substituted in place of the first electrical energy source, original plasma characteristics are substantially restored by adjusting he amplitude of an electrical signal from said second electrical source at said frequency f without requiring retuning of said second electrical energy source.

4. The apparatus of claim 3 wherein each of said electrical energy sources is comprises of an electrical generator and a coupling means for electrically coupling said electrical generator to said reactor.

5. The apparatus of claim 4 wherein said electrical filter is a low-pass electrical filter.

6. The apparatus of claim 5 wherein said low-pass filter is a Chebyshev filter.

7. A plasma processing apparatus for processing a reactive gas and in which said apparatus is coupled to a first electrical energy source which provides an electrical signal at a fundamental frequency f to generate an electrical energy field for generation of plasma in said apparatus comprising:

a reactor for processing said reactive gas therein;

an electrical filter coupled between said reactor and said first electrical energy source for passing said frequency f, but inhibiting harmonics of said fundamental frequency f generated due to a non-linear response characteristic of said plasma in said reactor from interacting with electrical circuit parameters of said first electrical energy source, such that when a second electrical energy source is substituted in place of the first electrical energy source, original plasma characteristics are substantially restored by adjusting the amplitude of an electrical signal from said second electrical source at said frequency f without requiring retuning of said second electrical energy source.

8. The apparatus of claim 7 wherein each of said electrical energy sources is comprises of an electrical generator and a coupling means for electrically coupling said electrical generator to said reactor.

9. The apparatus of claim 8 wherein said electrical filter a low-pass filter.

10. The apparatus of claim 9 wherein said low-pass filter is a Chebyshev filter.

11. A plasma process of exposing a material to a reactive gas in a reactor wherein said reactor is coupled to a first electrical source which provides an electrical signal at a fundamental frequency f to generate an electrical energy field for generation of plasma in said reactor, comprising inserting an electrical filter coupled between said reactor and said first electrical source to pass said frequency f, but to inhibit harmonics of said fundamental frequency f generated due to a non-linear response characteristic of said plasma in said reactor from interacting with electrical circuit parameters of said first electrical source, such that when a second electrical energy source is substituted in place of the first electrical source, original plasma characteristics are substantially restored by adjusting the amplitude of an electrical signal from said second electrical source at said frequency f without requiring retuning of said second electrical energy source.

12. The process of claim 11 wherein said electrical filter is a low-pass filter.

13. The process of claim 12 wherein said low-pass filter is a Chebyshev filter.

* * * * *

UNITED STATES PATENT AND TRADEMARK OFFICE
CERTIFICATE OF CORRECTION

PATENT NO : 5,302,882
DATED : April 12, 1994
INVENTOR(S): Paul A. Miller

It is certified that error appears in the above-identified patent and that said Letters Patent is hereby corrected as shown below:

Column 1, line 4, insert --The United States Government has rights in this invention pursuant to Contract No. DE-AC04-89AL58872 between the Department of Energy and SEMATECH, Inc.-- before "This".

Column 1, line 55, "system for" should be --system. For--.

Column 2, line 37, "possible" should be --impossible--.

Column 4, line 25, insert --,-- after "11".

Column 8, line 32, "he" should be --the--.

Column 8, line 37, "comprises" should be --comprised--.

Column 8, line 66, "comprises" should be --comprised--.

Signed and Sealed this

Fifth Day of August, 1997

*Attest:*

BRUCE LEHMAN

*Attesting Officer*   *Commissioner of Patents and Trademarks*